United States Patent [19]

Tomita

[11] 4,274,117
[45] Jun. 16, 1981

[54] DIGITAL RECORD LEVEL SETTING SYSTEM

[75] Inventor: Masao Tomita, Neyagawa, Japan

[73] Assignee: Matsushita Electric Industrial Co., Ltd., Osaka, Japan

[21] Appl. No.: 91,498

[22] Filed: Nov. 5, 1979

[30] Foreign Application Priority Data

Nov. 6, 1978 [JP] Japan .................................. 53-137108
Nov. 17, 1978 [JP] Japan .................................. 53-142592

[51] Int. Cl.³ .............................................. G11B 5/02
[52] U.S. Cl. ........................................ 360/68; 360/31
[58] Field of Search ...................... 360/68, 61, 65, 31, 360/69, 32

[56] References Cited

U.S. PATENT DOCUMENTS 4,169,219  9/1979  Bezro ..................................... 360/67

Primary Examiner—Vincent P. Canney
Attorney, Agent, or Firm—Wenderoth, Lind & Ponack

[57] ABSTRACT

A record level setting system in a tape recorder, by which a record level can be automatically adjusted without damaging high fidelity of the recorded signals. The system comprises a variable gain circuit, a level detector, an A-D converter, an operation switch, a time generator and a peak hold circuit. The maximum input level in a signal to be recorded is processed for a predetermined period by controlling the amplitude of the input signal in accordance with the digital signal from the peak holder.

10 Claims, 4 Drawing Figures

DIGITAL RECORD LEVEL SETTING SYSTEM

This invention relates to a record level setting system e.g. in a tape recorder, and more particularly to an improved digital record level setting system by which the record level is automatically and accurately set by using a digital technique.

Usually, in tape recorders, when a person wishes to record his program source, he has to adjust the record level, because if right record level setting is not done, the record condition is much distorted when the level of his program is very high, and the record condition becomes very noisy when the level is very small.

Generally, there are known two methods for the record level setting. One is a manual setting in which the amplitude fed to a recording head is adjusted to an optimum level by a variable resistor called input level adjustor and by monitoring a volume unit (VU) meter. Another one is an automatic setting called an automatic gain control (AGC) in which the amplitude fed to a recording head is automatically set in response to an average level of the input signal.

However, the former method has a disadvantage that the operation is very difficult because the value displayed by the VU mater moves each instance. Therefore, the operator cannot know the amount which he adjusts by the variable resistor. In the latter method, there is a probrem that the dynamic range of recorded signal is compressed for the input signal, that is the recorded signal has no high fidelity.

Up to present, several methods have been developed for improving the record level setting system. These methods are classified into two basic types. One is a method using a motor for driving a variable resistor, and the other is a method using an analog memory to hold the input signal level.

As an example of the first type, there is a voltage generator which generates a DC voltage responsive to the input signal level, with a motor having an axis coupled to a variable resistor and driven by the voltage generator. If a large input level is applied, the motor drives the variable resistor having a long distance from its start position. As a result, the variable resistor presents a large attenuation, and the large input signal is attenuated to an adequate level, and the signal is fed to a record head. Therefore, the record condition without saturation distortion is achieved.

However, such a method has several disadvantages. That is, this system has no sufficient reliability and cannot be assembled to a very small size, because it has some mechanical parts. Furthermore, the accuracy for the level setting is not sufficient.

An example of the second type consists of an analog memory which holds a DC voltage responsive to an input signal level, and a variable gain circuit which controls the gain responsive the DC voltage in the analog memory. In this system, sometimes the analog memory signal is changed to a new value by manual switch. As a result, it can set the gain responsive to a large input signal. In this system, ordinarily a capacitor is used for the analog memory, and a field effect transistor which presents a high input resistance is used for a variable gain element. However, it is difficult to hold a constant gain for a long time, because the memory voltage is gradually reduced by a leak current of said capacitor. Moveover, even if there were an ideal memory element without a leak current, the characteristics such as linearity and range of gain control would not be good, because this system handles analog values.

Therefore, an object of the present invention is to provide an improved record level setting system which controls the amplitude of alternating signals e.g. in a tape recorder.

Another object of the invention is to provide a record level setting system which has high accuracy using a digital technique.

A further object of the invention is to provide a record level setting system which automatically sets the record level by simple operation.

A further object of the invention is to provide a record level setting system which sets the record level by manual up and down switch.

A further object of the invention is to provide a record level setting system which can be applied to a multichannel tape recorder.

These objects are achieved by providing a record level setting system according to the present invention, which comprises: a variable gain circuit located within an input terminal and an output terminal; a level detector which detects the level of the signal applied to said input terminal; an A-D converter which converts to digital signal the analog voltage at said level detector; an operation switch for setting the record level automatically; a time generator of which the pulse width determines the period to search a maximum level of said level detector; and a peak hold means which holds the maximum value of said digital signal during said pulse width at said pulse generator, whereby the amplitude of said input signal applied to said input terminal is controlled in accordance with digital signal from peak holder so as to respond to the maximum input level for a constant period.

These and other objects of the invention will be apparent from the consideration of the following detailed description with reference to the accompanying drawings, in which.

Figure 1:
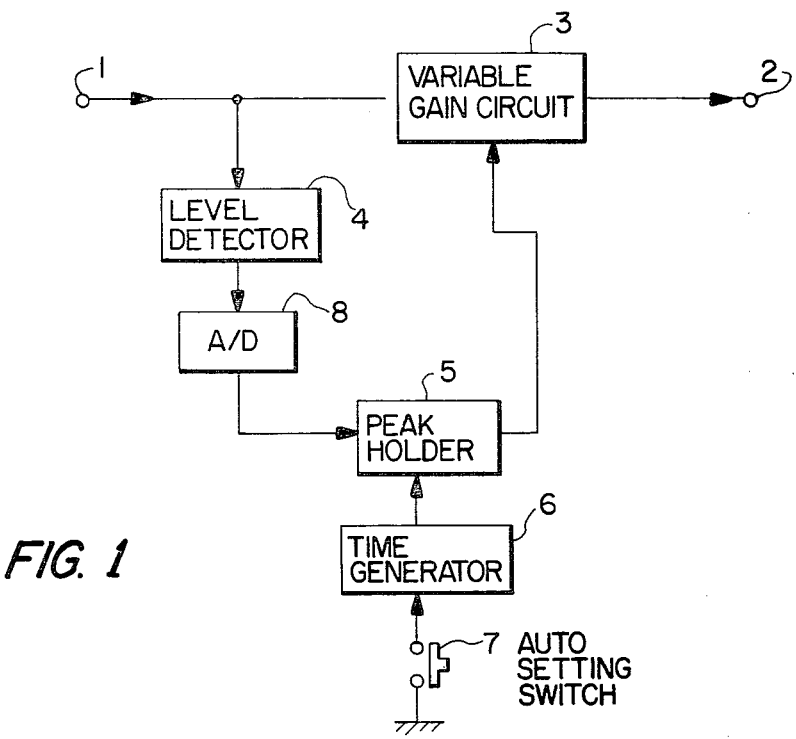
FIG. 1 is a basic block diagram of a digital record level setting system according to the present invention.

FIG. 1 is a block diagram showing a main circuit structure of an example of this invention, wherein reference numerals 1 and 2 are an input terminal and an output terminal of signals, respectively. 3 is a gain control circuit (variable gain circuit) for changing the gains between the input terminal 1 and the output terminal 3.

4 is a level detector and functions to detect the level of a signal applied to the input terminal 1. 8 is an A-D converter which converts the detected signal level to a digital signal. 5 is a peak holder (holding circuit) for holding in the form of a digital value the maximum value among the levels detected by the level detector 4, and functions to supply a control signal corresponding thereto to the gain control circuit 3. 6 is a time generator (setting circuit) for generating a pulse of a constant (predetermined) time period by operating an automatic setting switch 7, and supplies the pulse to the peak holder 5.

In the above structure, when an operator operates the automatic setting switch 7, the time generator 6 is immediately driven, and generates a pulse having a time period (pulse width) corresponding to the predetermined set time period, the pulse being applied to the peak holder 5. The peak holder 5 holds a maximum level among the levels detected by the level detector 4 within the time period set by the time generator 6, and applies a control signal corresponding thereto to the gain control circuit 3. Therefore, the gain control circuit 3 is controlled to a gain determined by the maximum level of the input signals within a constant time period.

Now, if the output terminal 2 is coupled to a recording signal amplifier of a tape recorder and a magnetic head is supplied with a recording current, the maximum held voltage measured during the time period determined by the time generator 6 controls the gain control circuit 3 so as e.g. to cause the peak value of the input signals to be recorded at a maximum recording level of the tape of the tape recorder.

By such technique, the maximum level of the input signals is recorded at the maximum recording level of the magnetic tape, and the other signal levels are recorded at recording levels lower than the maximum recording level. Thus, the input signals can be recorded without damaging the input signals by saturation distortion of the magnetic tape and without compressing the dynamic range of the input signals. Further, since it is only necessary to operate the automatic setting switch 7 for setting the record level, the operation is very much easier than the conventional record level setting.

What has made it possible to automatically set the record level by a single operation of the switch according to this invention is an experimental result showing that for almost all input signals, the time period of about 10 seconds is sufficient as a time period of maximum value measurement determined by the time generator 6.

Figure 2:
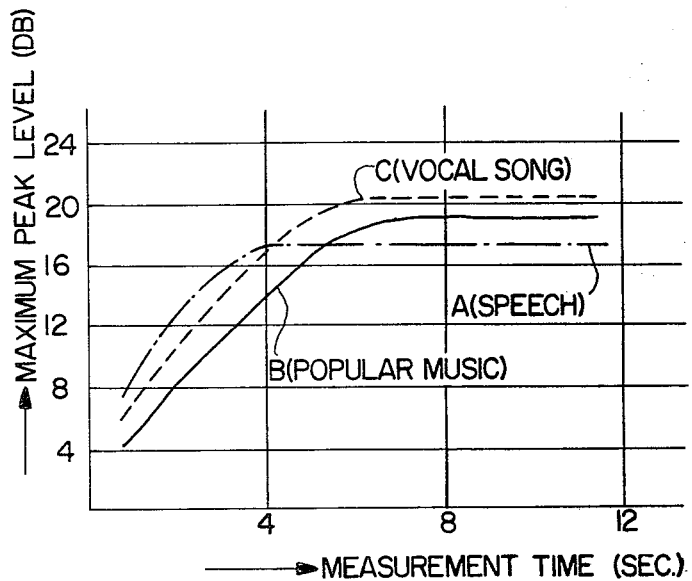
FIG. 2 is a graph illustrating measurement time v.s. maximum peak level characteristics which is a base on which the measurement duration for searching the maximum peak level is determined.

FIG. 2 is a graph showing an experimental result made by plotting the relationships between the maximum value measurement time and the measured maximum peak levels as to three kinds of input sources. When the source is A (speech), the maximum level saturates after about 4 seconds. This means that however longer the maximum measurement time is selected than 4 seconds, the maximum values hardly changes. Likewise, the saturation comes after about 7 seconds in the case of source B (popular music), or after about 5 seconds in the case of source C (vocal songs). Therefore, it is sufficent to set the maximum measurement time at about 8 to 10 seconds or a little longer, except for rare sources.

On the other hand, it is considered that it is better that this measurement time be shorter in view of easiness of operation by an operator. So, it is preferable to set the time period of the time generator 6 at about 5 to 10 seconds.

Figure 3:
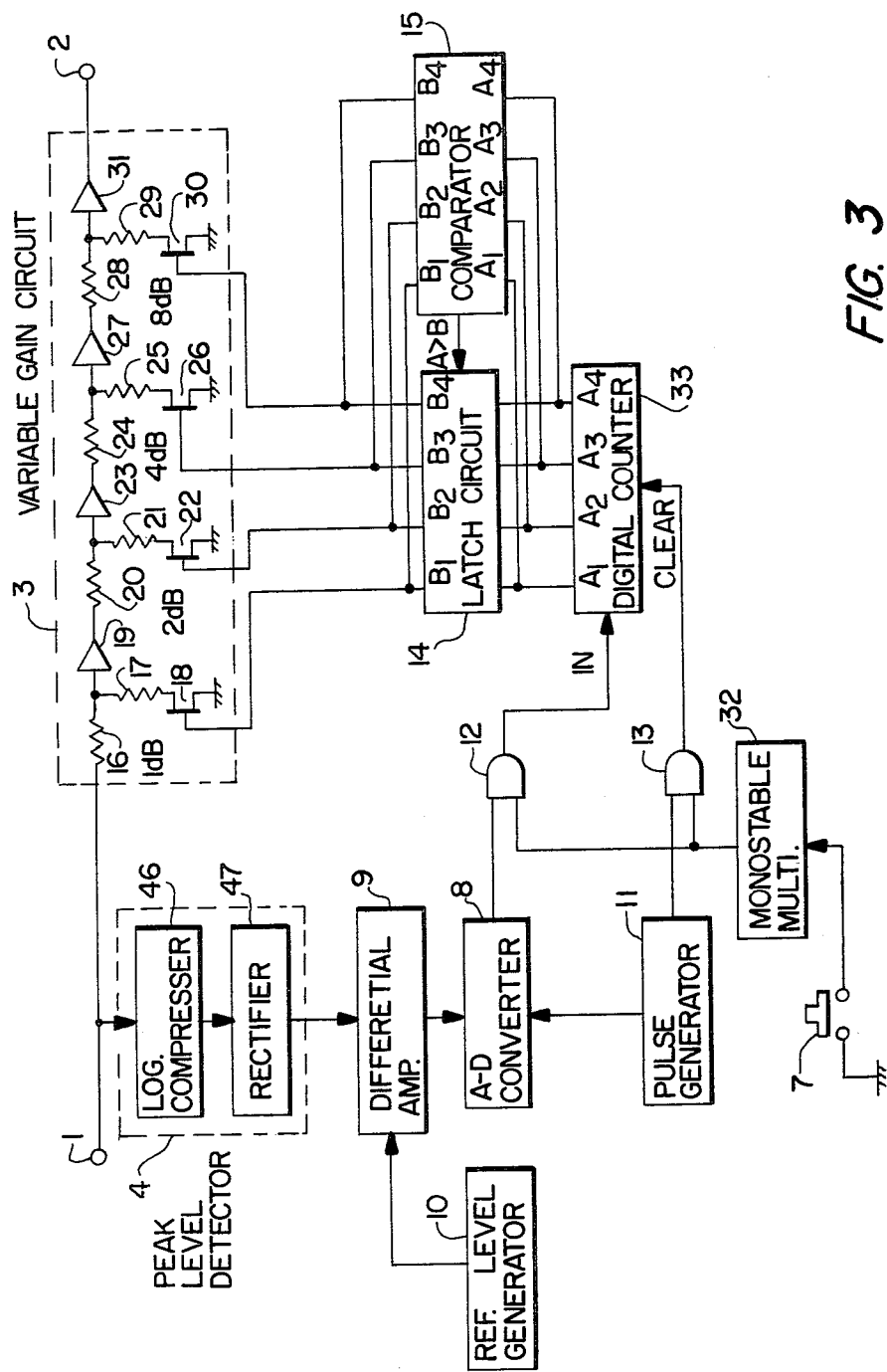
FIG. 3 is a more detailed block diagram of the digital record level setting system according to the present invention.

FIG. 3 shows a more concrete example of a main part of the invention, wherein like elements to those in FIG. 1 are designated by like reference numerals. In FIG. 3, the record level setting can be done by the single operation of operating the automatic setting switch 7. When the automatic setting switch 7 is short-circuited, a monostable multivibrator 32 is driven, and a pulse of a time period corresponding to a maximum measurement time explained with reference to FIG. 1 is generated, and is then supplied to AND gates 12 and 13.

Reference numerals 1 and 2 designate an input terminal and an output terminal of signals, respectively, and 3 is a group of resistance attenuators which are signal attenuators and are arranged between the input terminal 1 and the output terminal 2. A level detector 4 is coupled to the input terminal 1, and its output and an output from a reference level generator 10 are applied to a differential amplifier 9. The output of this differential amplifier 9 is fed to a digital counter 33 via an A-D converter 8 and an AND gate circuit 12. The outputs from the digital counter 33 are fed to the group of resistance attenuators via a latch circuit 14.

In this FIG. 3, the input terminal 1 is supplied e.g. with analog signals such as audio signals, and level-set analog signals are obtained at the output terminal 2.

In FIG. 3, the level detector 4 is a detecting circuit e.g. for detecting the peak level of the input signals, and is usually formed by a rectifier 47 comprising an absolute value circuit and a smoothing circuit of a small time constant. In this example, a logarithmic compressor 46 for logarithmically compressing input signals is additionally used for enabling satisfactory operation for input signals of a wide dynamic range, and for obtaining signals proportional to logarithm in order to cause the gains of the variable gain amplifier to correspond to dB values.

The reference level generator 10 is provided for supplying reference informations for performing level setting, and generates a DC voltage corresponding to an input level at which the variable attenuating circuit (gain circuit) 3 starts attenuation.

The differential amplifier 9 generates a voltage corresponding to a difference between the voltage corresponding to the input signal level obtained by the level detector 4 and the reference voltage from the reference level generator 10. Namely, a voltage corresponding to excessive amplitude of the input signal over the reference level determined by the reference level generator 10 is obtained at the output of the differential amplifier 9.

A pulse generator 11 generates clock pulses for the A-D converter 8 and clear pulses for clearing the digital counter 33 every time the A-D converter 8 performs sampling operation. The AND gates 12 and 13 and the monostable multivibrator 32 function to control the digital counter 33 to be in a counting state or a holding state by the operation of the switch 7. The latch circuit 14 and a comparator 15 function to hold a maximum counted value. The latch circuit 14 in its non-latch state feeds the counted value from the digital counter 33 to the output thereof a it is, while in its latch state, the latch circuit holds a previous value irrespectively of the input values. The comparator 15 compares the count outputs $A_1$, $A_2$, $A_3$, $A_4$ of the digital counter 33 with the outputs $B_1$, $B_2$, $B_3$, $B_4$ of the latch circuit, and produces an output pulse only when $A > B$, wherein this output pulse releases the latch of the latch circuit 14 into non-latch state and feeds the output of the digital counter 33 to the latch circuit 14.

As apparent from the above descriptions, the latch circuit 14 and the comparator 15 renew the latch output only when the count outputs $A_1$, $A_2$, $A_3$, $A_4$ of the digital counter 33 are larger than the latch outputs $B_1$, $B_2$, $B_3$, $B_4$, respectively, while they hold the latch output when the former value is smaller than the latter. Therefore, the maximum value of the counted values sequentially fed from the digital counter 33 is obtained at the output of the latch circuit 14.

The group of resistance attenuators (variable gain circuit) 3 comprises four stages of resistance attenuators and analog switches. Resistances 16, 17, an analog switch 18 and a buffer amplifier 19 constitute a first stage of resistance attenuator. The analog switch 18 is in conduction state when the output $B_1$ of the latch circuit supplied to its gate is "H" (high level of TTL logic), while it is in cut-off state when $B_1$ is "L" (low level of TTL logic). So, the first stage resistance attenuator shows an attenuation state to perform attenuation by the voltage division ratio between the resistances 16 and 17, when the output $B_1$ of the latch circuit 14 is "H". When the output $B_1$ is "L", the latch circuit is in non-attenuation state. The buffer amplifier 19 functions to prevent mutual influence between the first stage and the second stage of the resistance attenuator. Likewise, resistances 20, 21, an analog switch 22 and a buffer amplifier 23 constitute a second stage of resistance attennator. Resistances 24, 25, an analog switch 26 and a buffer amplifer constitute a third stage of resistance attenuator, and resistances 28, 29, an analog switch 30 and a buffer amplifier 31 constitute a fourth stage of resistance attenuator. These first to fourth stages of resistance attenuators are connected in series to form a group of resistance attenuators 3, wherein respective attenuators are set at different attenuation amounts from each other, e.g. 1 dB, 2 dB, 3 dB and 4 dB, respectively.

In the example of FIG. 3, when the level setting is to be performed, the switch 7 should be operated to bring the system to setting stage. Then, the monostable multivibrator 32 produces one pulse having a pulse width of 5 to 10 seconds. An input signal is converted to a DC voltage corresponding to the peak level of either positive or negative value, and is detected by the differential amplifier 9 as a level exceeding the reference voltage produced by the reference level generator 10, and is then sampled by the A-D converter 8 per a predetermined constant period. The thus obtained sampled values are converted e.g. to a pulse number and fed to the AND gate circuit 12 per the constant period. Now, since the switch 7 is operated to produce the pulse, a "H" level is applied to the other input terminal of the AND gate 12, and the output pulse of the A-D converter 8 is fed to the count input terminal (IN) of the digital counter 33. To the AND gate circuit 13, the "H" level from the monostable multivibrator 32 and the clearing pulse from the pulse generator 11 are applied, and its output is applied to the clear input of the digital counter 33. The clearing pulse from the pulse generator 11 is in synchronism with the sampling of the A-D converter 8 every constant period, and is generated just before the A-D converter 8 converts the sampled value to a pulse number as an output. In other words, the clearing pulse to be applied to the clear input terminal (CL) of the digital counter clears the counted value of the digital counter 33 to zero in order not to accumulate previous counted values, and causes the digital counter 33 to be ready for a count corresponding to a subsequent sampled value. Therefore, the digital counter 33 produces at its output a counted value corresponding to a sampled value obtained by sampling, every constant period, a level of iput signal exceeding a reference level. Among these counted values, maximum values, in a period while the monostable multivibrator 32 is producing pulses, are obtained at the outputs $B_1$, $B_2$, $B_3$, $B_4$ of the latch circuit 14 by the maximum-value-holding function of the latch circuit 14 and the comparator 15. The outputs of the latch circuit 14 are coupled to the respective analog switches 18, 22, 26, 30 of the resistance attenuator group 3, and cause the first to fourth stages of resistance attenuators to be in either attenuation or non-attenuation state so as to control the total attenuation amount of the resistance attenuator group. In this example, when the peak level of the input signal is very high, and all the outputs $B_1$, $B_2$, $B_3$, $B_4$ are "H", all the resistance attenuators are in attenuation state with an attenuation amount of 15 dB, whereby the signal applied to the input terminal 1 is attenuated by 15 dB and is then fed to the output terminal 2. On the other hand, when the peak level of the input signal is very low which is lower than the reference level, and all the outputs of the latch circuit 14 are "L", the resistance attenuator group is in non-attenuation state, whereby the input signal is fed to the output terminal 2 without attenuation. Therefore, signals of an almost constant level can be obtained at the output terminal 2 for input signals exceeding the reference level.

When the monostable multivibrator 32 stops producing a pulse, "L" level is applied to the inputs of the AND gate circuits 12 and 13. So, no pulse is applied to the count input terminal (IN) and the clear input (CL) of the digital counter 13, so that the counting operation or clearing operation are not done. Therefore, the output of the latch circuit 14 continues holding the previous counted value. Thus, while the monostable multivibrator 32 driven by the switch 7 operated by a single operation continues producing a pulse, the system is in setting state. On the other hand, while the pulses are not produced, the system is in holding state. In the setting state, peak values of the input signals are measured, and level setting corresponding to the peak values is performed. On the other hand, in the holding state, the level setting is held.

An automatic level setting apparatus according to the example of this invention can perform optimum level setting by merely operating the switch 7. So, the operator can be released from troublesome operation, and moreover there is no fear that the dynamic range of the input signal to be recorded is compressed. Further, since the system uses no mechanical components such as a motor and is operated purely electronically, it is easy to reduce the cost of the system. If the system of this invention is compared with the conventional analog type system, the former is much superior to the latter as to accuracy because it uses digital signal processing Further, the holding time in the holding state is permanent so long as the system is supplied with electric power, and there is no fear of set level drift due to a leak current.

Figure 4:
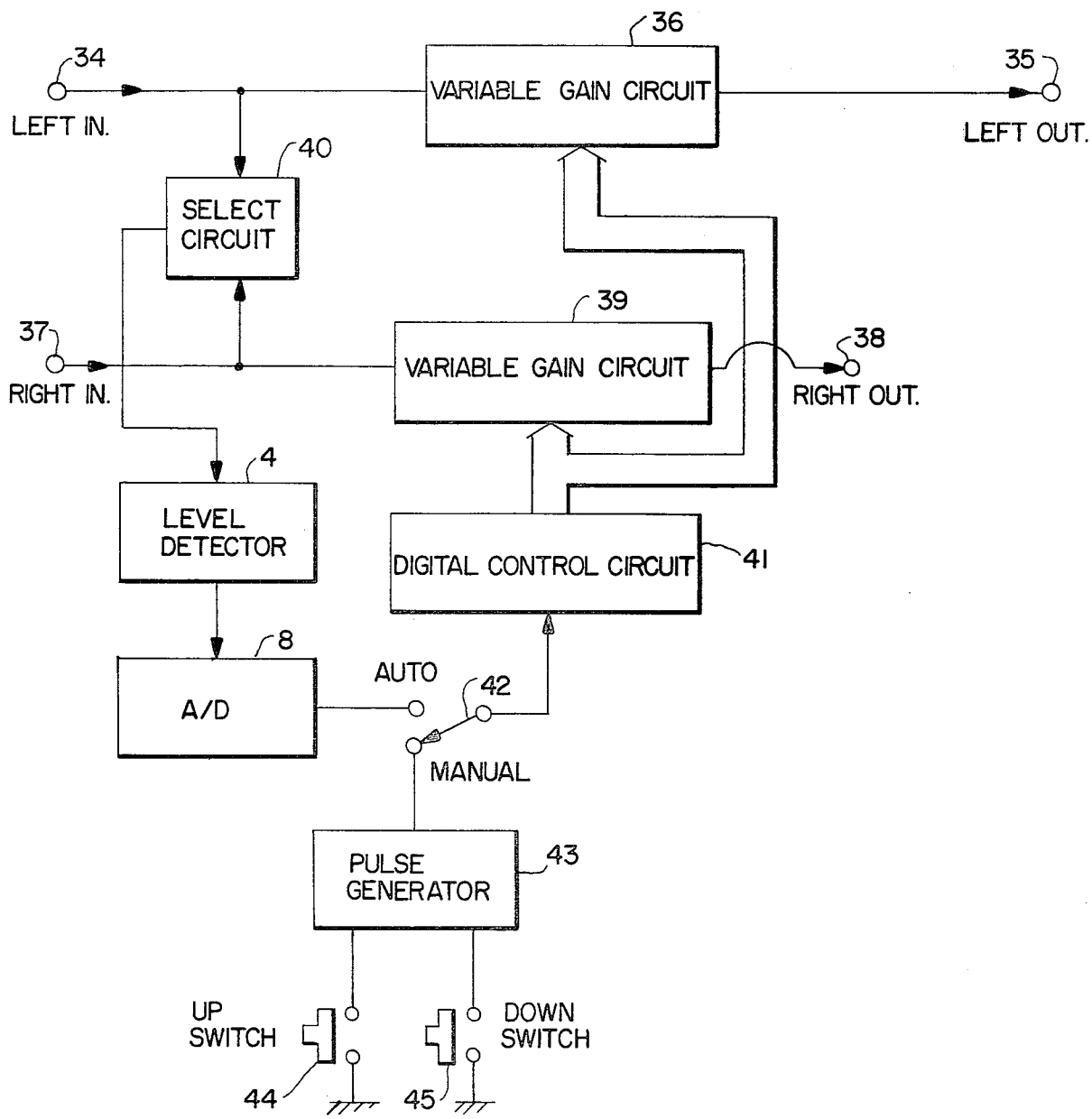
FIG. 4 is a block diagram of another example of a digital record level setting system according to the present invention.

FIG. 4 shows a signal level setting apparatus, in which: plural resistance attenuators (variable gain circuits) which are digitally controlled as to the gains in response to counted values of a digital counter are arranged on plural signal transmission paths, respectively; it can be selected whether to apply a pulse generated by manual operation to the count input of the digital counter or to apply thereto a pulse train of a pulse number corresponding to the signal level of the signal transmission path; and the signal levels of plural channels can be simultaneously adjusted, either manually or automatically, with only a small level deviation.

In FIG. 4, for simplifying the descriptions, a digital control circuit 41 is defined which corresponds to the combination of the counter 33, the latch circuit 14, the comparator 15, the AND gates 12, 13, the monostable multivibrator 32 and the operation switch 7.

Referring to FIG. 4, a select circuit 40 is supplied with a left input signal and a right input signal applied to input terminals 34 and 37, respectively, and selectively supplies either one of the two input signals to a level detector 4.

In the case of this automatic level controlling apparatus of FIG. 4, the select circuit 40 can be composed of an AND gate structure using a diode so as to select a larger one of the left input and right input signals. By using such arrangement, the output signals obtained at the output terminals 35 and 38 are automatically set in correspondence with a larger one of the left and right input signals. So, when it is applied to a recording circuit, each channel is suppressed to a level lower than a maximum recording level, and the level setting can be done with the left-right balance of the input signals being kept.

In FIGS. 4, 34, 37 and 35, 38 are signal input terminals and signal output terminals, respectively. 36, 39 are resistance attenuator groups (variable gain circuits) which are arranged between the input terminals 34, 37 and the output terminals 35, 38, respectively. The level detector 4 is coupled to the select circuit 40 to which the input signals from the terminals 34, 37 are fed, and the output from the level detector is fed to the digital control circuit 41 via the A-D converter 8 and a selection switch 42, and then to the resistance attenuator groups 36, 39.

In such structure, when the selection switch 42 is in a first state, i.e. manual mode, the level setting is done by manually operating an up-switch 44 and a down-switch 45. That is, when the operation switch 44 or 45 is operated, a pulse generator 43 produces a pulse for counting, and this counting pulse causes a counter in the digital control circuit 41 to perform counting operation. This counter produces a binary information corresponding to the counted value at an output of the digital control circuit 41, which information is then fed to the resistance attenuator groups 36, 39. Each resistance attenuator group 36, 39 comprises plural resistance attenuators including analog switches, and each resistance attenuator is set at an attenuation amount corresponding to the binary output of the counter. Therefore, the attenuation amount of the resistance attenuator groups 36, 39 can be digitally controlled by the operation of the operation switches 44, 45, and thus audio signals of any desired level can be obtained at the output terminals 35, 38 by manual operation of the operation switches 44, 45. In this manual mode, the digital control circuit 41 feeds to the resistance attenuator groups 36, 39 the counted outputs of the counter as they are.

Next, the operation upon a second state, i.e. automotic mode, of the selection switch 42 will be described.

Ordinarily, an automatically resettable switch is used for the selection switch 42. Only when the switch is operated, the automatic mode is selected, and the mode is auotmatically reset to the manual mode when operator releases the switch. Therefore, only when the operator wishes automatic level setting of the signal transmission path, he operates the selection switch 42 into the automatic mode. The operation of the system in the automatic mode has already been described above with reference to FIG. 3.

Thus, when the automatic mode is selected by operating the selection switch 42, the system is set at an attenuation amount corresponding to a maximum input among the inputs during the automatic mode period. Thus, when the maximum input is larger, the attenuation amount is set to be larger. When the selection switch 42 is released, it is automatically reset to manual mode, and the pulse input to the counter is cut off unless the operation switches 44, 45 are operated. So, in such reset state, the counter does not perform counting operation, and the counted value counted by the automatic mode is kept as it is. Therefore, the attenuation amount of the resistance attenuator groups 36, 39 is kept at a value set in the automatic mode.

The level setting by the auto-manual selection type signal level setting apparatus can be easily and effectively done by the operator's setting the selection switch 42 at the automatic mode for automatically setting the gain corresponding to the input signal level, and then by his operating the operation switches 44, 45 at the manual mode in order to change the level in accordance with his "taste" or "flair".

What is claimed is:

1. A digital record level setting system comprising:
    a variable gain circuit located within an input terminal and an output terminal;
    a level detector which detects the level of the signal applied to said input terminal;
    an A-D converter which converts to digital signal the analog voltage at said level detector;
    an operation switch for setting the record level automatically;
    a time generator of which the pulse width determines the period to search a maximum level of said level detector; and
    a peak hold means which holds the maximum value of said digital signal during said pulse width at said pulse generator, whereby the amplitude of said input signal applied to said input terminal is controlled in accordance with digital signal from peak holder so as to respond to the maximum input level for a constant period.

2. A digital record level setting system according to claim 1, wherein said variable gain circuit comprises plural attenuators using two or more resistors, buffer amplifiers and analog switch elements, whereby the attenuators are controlled to attenuation condition or non-attenuation condition in accordance with the states of said analog switch elements.

3. A digital record level setting system according to claim 2, wherein respective ones of said attenuators have attenuation ratios responsive to dB unit and digital code such as 1 dB, 2 dB, 4 dB, and so forth.

4. A digital record level setting system according to claim 1, wherein said level detector comprises a logarithm compressor means and a rectifier means.

5. A digital record level setting system according to claim 1, wherein the signal applied to the A-D converter is the output signal of a differential amplifier which is supplied with the output signal of said level detector and the reference signal from a reference level generator.

6. A digital record level setting system according to claim 1, wherein said time generator comprises a monostable multivibrator which generates a one-shot pulse by operating said operating switch.

7. A digital record level setting system according to claim 6, wherein the pulse width of said one-shot-pulse is about 5 to 10 seconds.

8. A digital record level setting system according to claim 1, wherein said peak hold means comprises a digital counter which is supplied with the pulse from said A-D converter, a latch circuit connected to said digital counter, and a comparator which compares the output of said digital counter and the output of latch circuit.

9. A digital record level setting system according to claim 8, wherein the input signal to said digital counter is the output of said A-D converter in a first mode and the pulse generated from the pulse generator which is driven by an up-switch and a down-switch in a second mode.

10. A digital record level setting system according to any of the preceding claims, which further comprises plural variable gain circuits which is controlled by a common digital signal at the same time.

* * * * *